United States Patent
Ma (10) Patent No.: US 9,300,258 B2
(45) Date of Patent: Mar. 29, 2016

(54) METHOD AND DEVICE FOR DRIVING DIGITAL SPEAKER BASED ON CODE CONVERSION

(71) Applicant: Suzhou Sonavox Electronics Co., Ltd, Suzhou, Jiangsu (CN)

(72) Inventor: Dengyong Ma, Suzhou (CN)

(73) Assignee: Suzhou Sonavox Electronics Co., Ltd., Suzhou (CN)

( * ) Notice: Subject to any disclaimer, the term of this patent is extended or adjusted under 35 U.S.C. 154(b) by 51 days.

(21) Appl. No.: 14/397,165

(22) PCT Filed: Dec. 3, 2012

(86) PCT No.: PCT/CN2012/085740
§ 371 (c)(1),
(2) Date: Jan. 6, 2015

(87) PCT Pub. No.: WO2014/085959
PCT Pub. Date: Jun. 12, 2014

(65) Prior Publication Data
US 2015/0110299 A1  Apr. 23, 2015

(30) Foreign Application Priority Data

Apr. 27, 2012  (CN) .......................... 2012 1 0128712

(51) Int. Cl.
| | |
|---|---|
| *H04R 3/00* | (2006.01) |
| *H04R 27/00* | (2006.01) |
| *H04R 5/02* | (2006.01) |
| *H03F 3/181* | (2006.01) |
| *H03M 3/00* | (2006.01) |

(52) U.S. Cl.
CPC .............. *H03F 3/181* (2013.01); *H03M 3/506* (2013.01); *H04R 3/00* (2013.01)

(58) Field of Classification Search
USPC ................................ 381/59, 85, 89, 111, 332
See application file for complete search history.

(56) References Cited

U.S. PATENT DOCUMENTS

| | | | | |
|---|---|---|---|---|
| 7,058,463 | B1 * | 6/2006 | Ruha ....................... | H03F 3/217 330/251 |
| 2005/0180499 | A1 | 8/2005 | Hsu | |

FOREIGN PATENT DOCUMENTS

| | | |
|---|---|---|
| CN | 1929778 | 3/2007 |
| CN | 102404672 | 4/2012 |
| CN | 102684701 | 9/2012 |

*Primary Examiner* — Duc Nguyen
*Assistant Examiner* — George Monikang
(74) *Attorney, Agent, or Firm* — Baker Donelson; Connie Ding; Peter L. Brewer (57) ABSTRACT

A method and device for driving a digital speaker based on code conversion are provided in the invention. The method comprises the steps of: (1) converting input format; (2) performing multi-bit Σ-Δ modulation; (3) thermometer code conversion; (4) dynamic mismatch-shaping processing; (5) pulse width modulation code conversion; and (6) controlling on/off status switching of the MOSFET of a full-bridge power amplification network to drive a digital speaker load sound. The device comprises a sound source, an input format converter, a multi-bit Σ-Δ modulator, a thermometer coder, a dynamic mismatch shaper, a code converter, a multi-channel digital amplifier and a digital speaker load which are connected to each other in sequence. By means of the device and method of the invention, the switching rate of the power tube, the power dissipation and heating generated during the switching are reduced, the sound quality and efficiency of electroacoustic restoration are improved, the volume, weight and implementation cost of the system are decreased, and the level of electromagnetic radiation is reduced. Furthermore, the device and method of the invention also have excellent immunity to the frequency response deviation of multiple digital channels.

18 Claims, 5 Drawing Sheets

| parameter name | ideal parameter | CSD conversion | CSD value |
|---|---|---|---|
| a1, b1 | 0.2065 | $2^{-2}-2^{-6}-2^{-9}$ | 0.2031 |
| a2, b2 | 0.2109 | $2^{-2}-2^{-6}-2^{-7}$ | 0.2109 |
| a3, b3 | 0.2289 | $2^{-2}-2^{-5}-2^{-8}$ | 0.2305 |
| a4, b4 | 0.2838 | $2^{-2}+2^{-5}+2^{-8}$ | 0.2832 |
| a5, b5 | 0.4656 | $2^{-1}-2^{-5}-2^{-8}$ | 0.4648 |
| b6 | 1 | ---- | ---- |
| c1 | 0.1205 | $2^{-3}-2^{-8}-2^{-10}$ | 0.1206 |
| c2 | 0.2904 | $2^{-2}+2^{-5}+2^{-7}$ | 0.2891 |
| c3 | 0.5926 | $2^{-1}+2^{-4}+2^{-8}$ | 0.5938 |
| c4 | 1.3746 | $2^{0}+2^{-2}+2^{-3}$ | 1.3750 |
| c5 | 3.8554 | $2^{2}-2^{-4}-2^{-7}$ | 3.8594 |

METHOD AND DEVICE FOR DRIVING DIGITAL SPEAKER BASED ON CODE CONVERSION

CROSS REFERENCE TO RELATED APPLICATIONS

This application is a §371 National State Application of PCT/CN2012/085704 filed Nov. 30, 2012 which claims priority to CN 201210128712.2 filed Apr. 27, 2012, which are incorporate by reference in their entirety.

FIELD OF THE INVENTION

The present invention relates to a method and device for driving a digital speaker, more particularly to a method and device for driving a digital speaker based on code conversion.

DESCRIPTION OF THE RELATED ART

With the rapid development of the large scale integrated circuit and the digital technology, the inherent defects of a conventional analog speaker system are becoming more and more obvious in power dissipation, volume, and weight, as well as in the transmission, storage, and processing of signals and the like. In order to overcome these defects, the research and development of the speaker system is gradually heading for the low power dissipation, small outline, digitization and integration, thereby forming a new research field taking the digitization of speaker loads as a research core.

Figure 1:
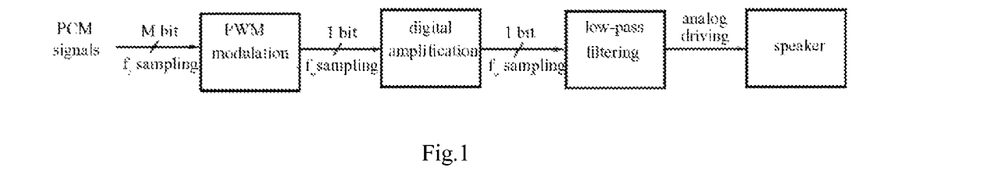
FIG. 1 is a block diagram illustrating the component modules of the conventional digital speaker system based on PWM modulation.

Currently, US patents (US 20060049889A1, US 20090161880A1) disclose digital speaker systems based on PWM modulation and class-BD power amplification technology. As shown in FIG. 1, at first the PCM coded signals with a word length of M-bit and a sampling rate of $f_s$ are converted into PWM coded signals with a word length of 1-bit and a sampling rate of $f_o$ by means of pulse width modulation (PWM); then the PWM signals are converted into power switch signals with a word length of 1-bit and a sampling rate of $f_o$ after the amplification of a digital amplifier; finally the power switch signals are converted into analogue power signals by low-pass filtering to drive the speaker load sound. Such a digital speaker system based on PWM modulation technology has inherent nonlinear defects due to modulation structure thereof, this will result in high total harmonic distortion level of the system restoration signals, while if a further linearization means is utilized for improving it, the realization difficulty and complexity of such modulation manner will rise sharply. Additionally, the modulated carriers used by the system will cause high electromagnetic interference on the surroundings to affect the operating of the other devices.

In order to overcome the defects of nonlinear distortion and electromagnetic interference existing in the PWM modulation technology, many researchers have devoted their efforts to studying the implementation method of the digital speaker system based on $\Sigma$-$\Delta$ modulation technology, to improve the linearity of the modulation technology itself and eliminate the nonlinear distortion components arisen by the modulation part.

Figure 2:
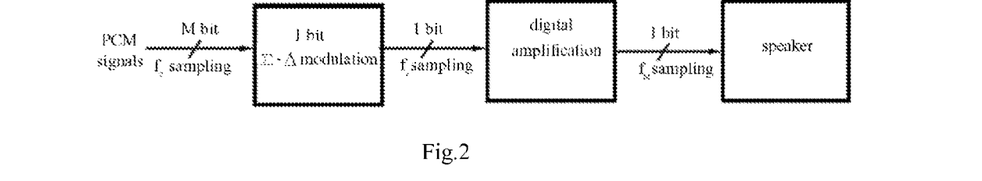
FIG. 2 is a block diagram illustrating the component modules of the conventional digital speaker system based on 1-bit $\Sigma$-$\Delta$ modulation.

The digital speaker systems based on $\Sigma$-$\Delta$ modulation technology generally are divided into two types: the digitization systems of 1-bit $\Sigma$-$\Delta$ modulation and the digitization systems of multi-bit $\Sigma$-$\Delta$ modulation. As shown in FIG. 2, the circuit implementation of the digitization systems of 1-bit $\Sigma$-$\Delta$ modulation is easy, however, such systems themselves have the following several defects: (1) they are sensitive to clock jitter, and nonlinear distortion may be easily caused by the clock jitter; (2) the allowable dynamic range of the input signals is small, so that the stability of the modulation structure can be maintained; (3) a higher switching rate is required, however, a power MOSFET (Metal Oxide Semiconductor Field Effect Transistor) will generate more nonlinear distortion components in the course of driving the high speed on/off action the speaker load, and also the phenomenon of increased heating, temperature, and reduced efficiency of the MOSFET will be caused.

Figure 3:
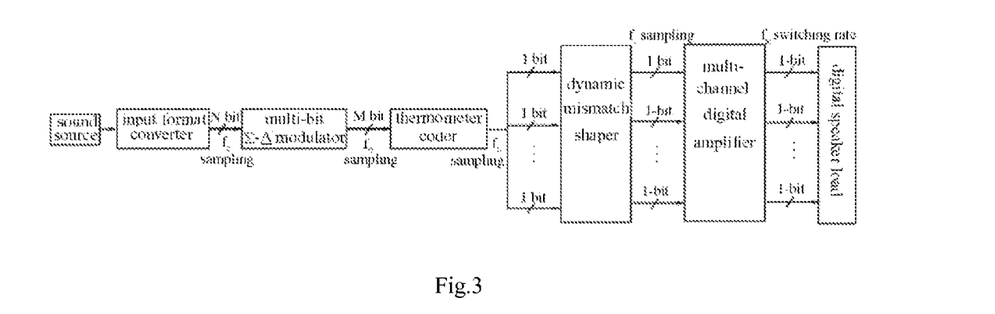
FIG. 3 is a block diagram illustrating the component modules of the conventional digital speaker system based on multi-bit $\Sigma$-$\Delta$ modulation.

In order to solve the defects existing in the digital systems based on 1-bit $\Sigma$-$\Delta$ modulation, many scholars also have devoted themselves to the research of the digital systems based on multi-bit $\Sigma$-$\Delta$ modulation, as shown in FIG. 3. However, the multi-bit $\Sigma$-$\Delta$ modulation technology itself has a fatal defect while overcoming the above defects of the 1-bit $\Sigma$-$\Delta$ modulation: its modulation structure has high sensitivity to the inconsistency of multiple speaker units (or voice units), and thus big coding error may be easily caused by the inconsistency of the multiple units. For example, for a 5-order 3-bit $\Sigma$-$\Delta$ modulator with an over-sampling factor of 32, when 1% error exists between the digital-to-analogue conversion units, theoretically, the Signal to Noise Ratio (SNR) will decrease 40 dB, and meanwhile, more harmonic distortion components may be caused. For the digital speaker systems based on multi-bit $\Sigma$-$\Delta$ modulation, it is required to utilize the mismatch-shaping dynamic element matching (DEM) to eliminate the effect of the frequency response difference of speaker units (or voice coil units). Furthermore, the decrease of SNR and increase of the harmonic distortion arisen from the frequency response difference of speaker units (or voice coil units) are eliminated by means of loop circuit shaping filtering.

The digital systems based on multi-bit $\Sigma$-$\Delta$ modulation overcome the effect of the frequency response deviation of channels by means of mismatch shaping algorithms. However, Such digital system still have a high sampling rate of MHz order, this high sampling rate leads to high switching frequency of the post-stage power MOSFET, making many sharp burs of high magnitude be present at the rising and falling edges of the square signals output by the system. These sharp burs will cause that noise of large order is existing in the system restoration acoustical signals. Furthermore, the high switching frequency of the post-stage MOSFET will lead to the problems of excessive heating, increased power dissipation and significantly reduced output efficiency. Currently, the power MOSFET only has a switching frequency of hundreds of KHz, and thus can not meet the requirements of the switching rate of the digital systems based on $\Sigma$-$\Delta$ modulation, and this causes that the physical implementation of such digital systems still is very difficult.

Figure 4:
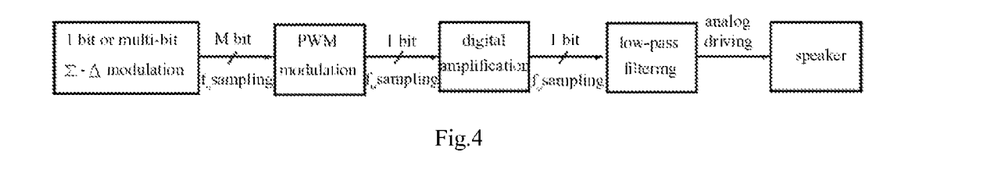
FIG. 4 is a block diagram illustrating the component modules of the conventional Class-D system based on $\Sigma$-$\Delta$ modulation.

In order to overcome the defect of high switching rate of the $\Sigma$-$\Delta$ modulation, as shown in FIG. 4, in the conventional Class-D amplifiers based on $\Sigma$-$\Delta$ modulation, 1-bit or multi-bit $\Sigma$-$\Delta$ modulation signals with a high switching rate are converted by PWM modulation into PWM modulated signals with a low switching rate, and amplified by the power MOSFET of the digital amplifiers into power signals, and then low-pass filtered to drive the speaker sound in analog driving means. By combining the $\Sigma$-$\Delta$ modulation with the PWM modulation, such Class-D systems based on $\Sigma$-$\Delta$ modulation keep the harmonic suppression ability of $\Sigma$-$\Delta$ modulation and reduce the switching rate of the power MOSFET, thereby reducing the quantity and magnitude of sharp burs during the switching of switch, and decreasing the switching loss of the power MOSFET. However, such conventional Class-D systems based on $\Sigma$-$\Delta$ modulation do not consider the problem of digitization of multiple input channels involved by the speaker array consisted of multiple speaker units or multi voice-coil speaker consisted of multiple voice coils, and do not consider the unified digital coding of multiple input channels. Such systems only relate to the stage of digitization of single input channel, and do not have the deviation correction function of multiple channel frequency response contained in dynamic mismatch shaping algorithms.

Considering the defect of the high switching rate existing in the digital systems based on Σ-Δ modulation, and the problem of unified digital coding of multiple input channels not involved by the Class-D systems based on Σ-Δ modulation, a method for reducing the switching rate of digital systems exists to be researched, to retain the functions of harmonic suppression and deviation correction of channel frequency response contained in dynamic mismatch shaping algorithms, and improve the quality of audio reproduction and reduce the power dissipation and heating of the system.

SUMMARY OF THE INVENTION

An object of the invention is to provide a method and device for driving a digital speaker based on code conversion, for overcoming the defect of the high switching rate existing in the digital systems of multi-bit Σ-Δ modulation and solving the problem of unified coding of multiple channels not involved in conventional Class-D systems based on Σ-Δ modulation.

Figure 5:
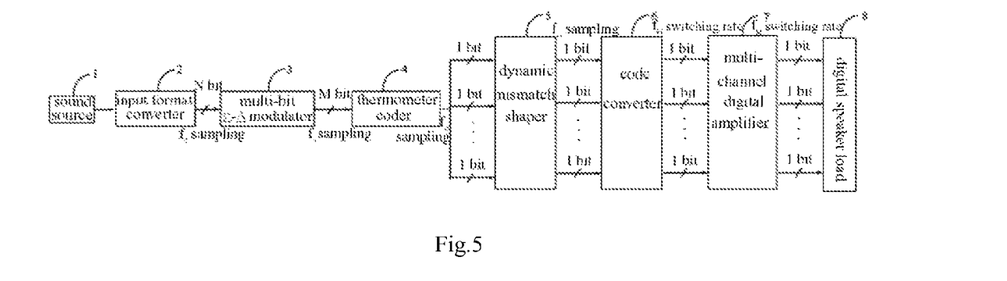
FIG. 5 is a block diagram illustrating the component modules of a device for driving a speaker system based on code conversion.

For the above purpose, in one aspect the invention provides a method for driving a digital speaker based on code conversion, as shown in FIG. 5, the method comprises the following steps:
(1) Converting input format, to convert input signals into PCM coded signals meeting the requirements of parameter;
(2) Performing multi-bit Σ-Δ modulation, to push the noise energy within audio bandwidth out of the audio band;
(3) Thermometer code conversion, to convert low-bit PCM coded signals with a bit-width of M into 1-bit coded signals of a digital power amplifier and a speaker load corresponding to $2^M$ channels, and to distribute the M-bit coded signals to $2^M$ digital channels in terms of equal weight, the digital signals on each channel only having two coding states of '0' and '1';
(4) Dynamic mismatch-shaping processing, to perform dynamic mismatch-shaping processing on the binary status code vectors of $2^M$ channels obtained by the thermometer code conversion based on the binary status codes of '0' and '1', thereby eliminating the harmonic distortion components arisen from the frequency response difference between the post-stage digital-to-analog conversion loads of $2^M$ channels and reducing the noise amplitude;
(5) Pulse width modulation code conversion, to convert the coded signals in PDM format on each channel obtained after multi-bit Σ-Δ modulation and dynamic mismatch-shaping processing into PWM coded signals; and
(6) Controlling the on/off status switching of the MOSFET of a full-bridge power amplification network to drive a digital speaker load sound, wherein the on-off status switching means that each digital transmission channel controls the on/off action of the full-bridge power amplification circuit by means of the converted PWM coded signals and control signals which constitute differential PWM signals with inverse signals thereof.

Preferably, the input signals to be converted in step (1) are analog signals and digital signals which in step (1) are firstly converted into digital signals based on PCM coding by analog-to-digital conversion, and then are converted in terms of the requirements of parameter of a designated bit-width and a sampling rate into PCM coded signals meeting the requirements of parameter, or digital signals which in step (1) are converted into PCM coded signals meeting the requirements of parameter in terms of the requirements of parameter of a designated bit-width and a sampling rate.

More preferably, the process of the multi-bit Σ-Δ modulation in step (2) is as follows: interpolation filtering by an interpolation filter the high-bit PCM code after equalization processing according to a designated over-sampling factor, to obtain over-sampling PCM coded signals; and then performing Σ-Δ modulation to push the noise energy within audio bandwidth out of the audio band, thereby assuring the high enough signal-to-noise ratio in band of the system and reducing the coding bit digit due to the conversion of high-bit PCM code into low-bit PCM code.

Still more preferably, the structure and parameters of the multi-bit Σ-Δ modulator applied by the multi-bit Σ-Δ modulation in step (2) are designed utilizing various existing design methods of multi-bit Σ-Δ modulators, such as higher-order single-stage serial modulation method or multi-stage (Casade, MASH) parallel modulation method, such that the noise-shaping is performed on the over-sampling signals output from the interpolation filter to push the noise energy out of the audio band, thereby assuring the high enough signal-to-noise ratio in band of the system.

Preferably, in the dynamic mismatch-shaping processing of step (4), the various existing dynamic mismatch shaping algorithms, such as DWA (Data-Weighted Averaging), VFMS (Vector-Feedback mismatch-shaping) and TSMS (Tree-Structure mismatch shaping) algorithms are utilized to design the structure and parameters of a dynamic mismatch-shaper, to whiten and shape the nonlinear harmonic distortion frequency spectrum arisen from frequency response difference between multiple digital channels, for reducing the magnitude of the harmonic distortion components in band and pushing the power thereof to the high frequency section out of band, thereby increasing the magnitude of signal to noise ratio in band while eliminating the harmonic distortion components in band.

More preferably, in the pulse width modulation code conversion of step (5), the 1-bit data stream with a switching rate of $f_o$ of $2^M$ channels obtained by a dynamic mismatch-shaper is converted in terms of PWM coding into 1-bit data stream with a switching rate of $f_M$ of $2^M$ channels, and the original PDM coded signals with a high switching rate are converted into PWM (Pulse Density Modulation) coded signals with a low switching rate on each channel. After the amplification of the power MOSFET, these PWM coded signals with a low switching rate still can retain the abilities of harmonic suppression and channel deviation immunity. Meanwhile, the quantity and magnitude of sharp burs generated during the switching of the power MOSFET are reduced, and power dissipation during the switching is reduced.

Preferably, the pulse width modulation code conversion of step (5) means that, the coded signals in PDM format obtained after the processing of multi-bit Σ-Δ modulator and dynamic mismatch shaper are converted into coded signals in PWM coded signals. Specifically, the coded signals in PDM format are converted in terms of the principle of equal length of data frame into PWM coded signals, and during the conversion the data frames of the PDM and PWM coded signals align with each other on time, the PDM coded signals comprise multiple high levels within the length of one data frame, and the same quantity of high levels are still retained in the course of converting to PWM coded signals, and the pulse width of the high levels of the PWM coded signals is equal to the sum of the pulse width of all the high levels of the PDM coded signal.

Figure 9A:
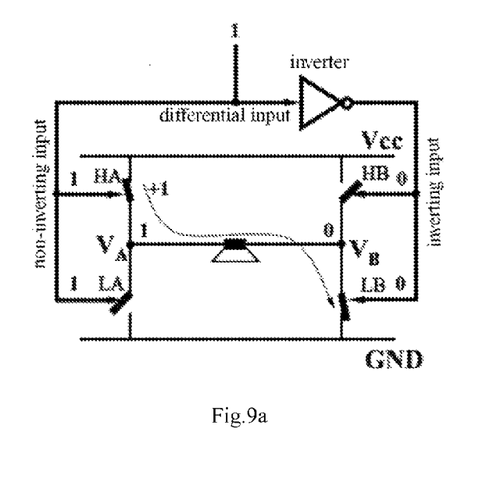
FIG. 9*a* is a schematic drawing showing the on/off action of the switch of the full-bridge driving network when inputting in the state of '1'.
Figure 9B:
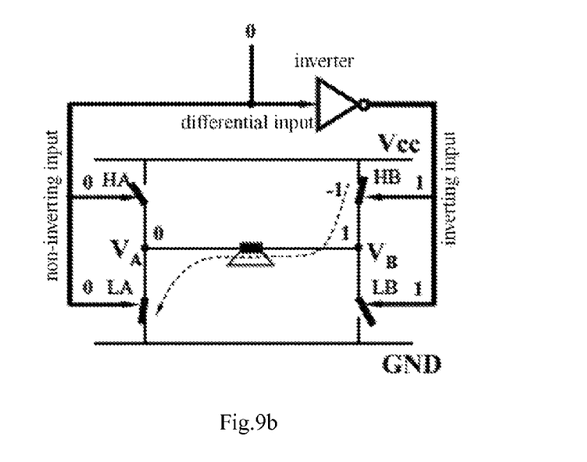
FIG. 9*b* is schematic drawing showing the on/off action of the switch of the full-bridge driving network when inputting in the state of '0'.

More preferably, the on/off status switching of the step (6) is controlled as follows: when the on/off action of the full-bridge power amplification circuit is controlled by the binary status code of '0' and '1', in the case of inputting in two states, the switching of the MOSFET and flowing direction of current are shown in FIG. 9. Provide that 'HA' and 'LA' respectively represent the reference numbers of the high-edge and low-edge MOSFET at A side, and 'HB' and 'LB' respectively represent the reference numbers of the high-edge and low-edge MOSFET at B side, when inputting at the state of '0', HA and LB are simultaneously turned on and HB and LA are simultaneously turned off, such that the current flows from A end to B end through the speaker unit and the voltage on the speaker unit is '$+V_{CC}$', and when inputting at the state of '1', HB and LA are simultaneously turned on and HA and LB are simultaneously turned off, such that the current flows from B end to A end through the speaker unit and the voltage on the speaker unit is '$-V_{CC}$'.

Still more preferably, the digital speaker load of the step (6) may be a digital speaker array consisting of a plurality of speaker units, or a speaker unit having multiple voice coil windings, or a digital speaker array consisting of a plurality of speaker units of multiple voice coils.

In another aspect, the invention provides a device for driving a digital speaker based on code conversion, and the device comprises a sound source, an input format converter, a multi-bit $\Sigma$-$\Delta$ modulator, a thermometer coder, a dynamic mismatch shaper, a code converter, a multi-channel digital amplifier and a digital speaker load. The sound source is the information to be played by a system. The input format converter is electrically coupled to the output end of the sound source for converting the input signals into high-bit PCM coded signals with a bit-width of N and a sampling rate of $f_S$. The multi-bit $\Sigma$-$\Delta$ modulator is electrically coupled to the output end of the input format converter for converting the input N bit PCM coded signals into low-bit PCM coded signals with a bit-width of M and a sampling rate of $f_o$. The thermometer coder is electrically coupled to the output end of the multi-bit $\Sigma$-$\Delta$ modulator for converting the M bit PCM coded signals into binary code vectors with a bit-width of M and a sampling rate of $f_o$ corresponding to $2^M$ digital channels. The dynamic mismatch shaper is electrically coupled to the output end of the thermometer coder for eliminating the nonlinear harmonic distortion components of spatial domain synthetic signals arisen from the frequency response difference between array element channels of the digital speaker load, reducing the magnitude of harmonic distortion components in band, and pushing the power of harmonic frequency components to the high frequency section out of band, thereby improving the sound quality of the multi-bit $\Sigma$-$\Delta$ coded signals. The code converter is electrically connected to the output end of the dynamic mismatch shaper for performing data frame splitting in terms of a low switching rate $f_M$ on the binary status code data stream of $2^M$ digital channels with a high switching rate and a sampling rate of $f_o$, such that each data frame of PDM coding on each transmission channel is converted in terms of the quantity of high levels (state of '1') into corresponding data frame of PWM coded signals. Thus, the original PDM coded signals with a high switching rate are converted into PWM coded signals with a low switching rate, such that the abilities of harmonic suppression and deviation correction of channel frequency response contained in the multi-bit $\Sigma$-$\Delta$ modulator and the dynamic mismatch shaper are retained, meanwhile, the switching rate of the post-stage power MOSFET is reduced, the nonlinear distortion arisen during the switching of the power MOSFET is reduced, the quantity and magnitude of the sharp burs generated at the transition edge of the power switching signals and the problems of power dissipation are decreased, and the problems of power dissipation and heating of the post-stage power MOSFET are reduced. The multi-channel digital amplifier is electrically coupled to the output end of the code converter for amplifying power of the coded signals of $2^M$ digital channels, and driving the on/off action of the post-stage digital load. The digital speaker load is electrically coupled to the output end of the multi-channel digital amplifier for achieving the electro-acoustic conversion and converting the digital electric signals of switch into air vibration signals in analog format.

Preferably, the sound source is analogy signals or digital coded signals. The analogy signals are derived from the analogy audio signals generated by various analogy devices, and the digital coded signals are generated by various digital devices.

More preferably, the input format converter contains digital interface circuits and interface protocol programs, such as analog-digital converters, USB, LAN, COM, which are compatible with the existing digital interface formats. The device for driving the digital speaker can transfer and exchange information with other devices flexibly and conveniently by means of these interface circuits and interface protocol programs. Meanwhile, the originally input analogy or digital audio signals are converted into high-bit PCM coded signals with a bit-width of N and a sampling rate of $f_s$ by the processing of the input format converter.

Still more preferably, the signal processing of the $\Sigma$-$\Delta$ modulator (3) is as follows: at first the PCM coded signals with a bit-width of N and a sampling rate of $f_s$ are subjected to over-sampling interpolation filtering according to the over-sampling factor $m_0$ to obtain the PCM coded signals with a bit-width of N and a sampling rate of $f_0$, and then the PCM coded signals with a bit-width of N are converted into the low-bit PCM coded signals with a bit-width of M, thereby reducing the bit-width of the PCM coded signals M<N.

Still further more preferably, the $\Sigma$-$\Delta$ modulator performs noise shaping on the over-sampling signals output from the interpolation filter to push the noise energy out of band, in terms of various existing the signal processing structures, such as a higher-order single-stage serial modulator structure or a multi-stage parallel modulator structure.

Preferably, the thermometer coder is used for converting the low-bit PCM coded signals with a bit-width of M into 1-bit coded signals corresponding to $2^M$ digital channels, thereby converting the M bit signals of single channel into single bit signals of $2^M$ digital channel in terms of equal weight, and introducing the speaker unit to the coding process to achieve the digitization of the speaker unit.

More preferably, the dynamic mismatch shaper utilizes the various existing dynamic mismatch shaping algorithms, such as DWA (Data-Weighted Averaging), VFMS (Vector-Feedback mismatch-shaping) and TSMS (Tree-Structure mismatch shaping) algorithms, to shape the 1-bit coded signal vectors of $2^M$ digital channels on the basis of the binary status codes of '0' and '1', for eliminating the nonlinear harmonic distortion frequency spectrum components arisen from the frequency response difference between multiple array element channels, thereby reducing the power level of the noise in voice-band.

Still more preferably, the code converter performs data frame splitting in terms of a low switching rate $f_M$ on the high-speed switching signals with a sampling rate of $f_o$ on $2^M$ digital channels, and the pulse width of the converted PWM codes is determined for each PDM coded data frame on each channel according to the quantity of the high level (state of '1') therein, thereby converting each PDM coded data frame into PWM coded data frame.

Still further more preferably, the quantity of channels of the multi-channel digital amplifier is $2^M$, the digital amplifier on each channel is a 13 full-bridge power amplification circuit comprising two half-bridge power amplification circuits, and each half-bridge including a high-edge MOSFET and a low-edge MOSFET. The switching of two different states can be achieved by controlling the on/off action of the four MOSFETs.

Preferably, each digital channel of the digital speaker load may be consisted of single or multiple speaker units, or single or multiple voice coils, or alternatively consisted of multiple voice coils and multiple speaker units.

More preferably, the array configuration of the digital speaker load is arranged according to the quantity of speaker units and the practical application demand, to form various array configurations applicable to actual application requirements.

As compared with the prior art, the invention has the following advantages:

(1) The multi-bit $\Sigma$-$\Delta$ modulation employed in the invention pushes the noise power to high frequency region out of band by noise shaping, thereby ensuring the demand of high SNR in band. This modulation technique has a simple and low-priced hardware realization circuit, and has excellent immunity to the parameter deviations caused in the manufacturing process of the circuit elements.

(2) The dynamic mismatch shaping algorithm utilized in the invention can effectively reduce the magnitude of the nonlinear harmonic distortion arisen from the frequency response difference between digital channels and improve the sound quality of the composite signals of multiple channels, thus, the driving device of the invention has excellent immunity to the frequency response deviation between the multiple digital channels.

(3) By means of the code converter of the invention, the PDM coded signals with a high switching rate on the multiple digital channels obtained by multi-bit modulation and dynamic mismatch shaping are converted into PWM coded signals with a lower switching rate, this avoids the problem caused by the high switching rate that a large mount and magnitude of sharp burs are present at the transition edges of input signals during the switching of the post-stage power MOSFET, thereby reducing the nonlinear distortion level of the restoration signals of the digital system, reducing the power dissipation and heating caused during the switching of the power MOSFET, and improving the electroacoustic conversion efficiency of the system.

(4) By means of code conversion, the PWM coded signals generated by the code converter of the invention still retain the abilities of harmonic suppression and anti-noise of the multi-bit modulator. Furthermore, by means of code conversion, the dynamic unified coding of multiple digital channels can be ensured while the switching rate of each channel is reduced.

(5) The code converter of the invention can achieve the transplantation and modification by code replication and editing in digital signal processors, such as DSP and FPGA, and this implementation is simple and low-cost.

(6) The digital driving device of the invention has excellent anti-interference capacity, and thus can stably and reliably run in the complicated environment of electromagnetic interference.

(7) The invention effectively avoids the nonlinear distortion of each speaker unit (or voice coil unit) caused by overload by utilizing the driving means of alternative switching, thereby elongating the working life of each speaker unit (or voice coil unit), and ensuring the sound level of the radiated acoustic field. Furthermore, the power amplifier circuit and digital load utilize the switching mode, and thus have higher electroacoustic conversion efficiency and less heating of the transducer.

(8) In the invention, the amplified switch signals are directly transmitted to speaker and the on/off action of the speaker is further controlled, and it is not required to add any inductor and capacitor of large volume and high-priced in the post-stage circuit of the digital power amplifier for the analog low-pass processing, thus the volume and cost of the driving device is reduced, and the integration level of the device is improved. Further, for the piezoelectric transducer load with capacitive characteristic, generally it is needed to add an inductor for the impedance matching to increase the output acoustic power of the piezoelectric speaker, and the impedance matching effect of applying digital signals on transducer end is superior to the same of applying analog signals on transducer end.

(9) The multi-bit $\Sigma$-$\Delta$ modulator and dynamic mismatching shaper of the invention can shape the high-order harmonic to disperse the harmonic power to the entire frequency range, thereby reducing the electromagnetic interference caused by the high-order harmonic radiation, and ensuring the normal operation of the other devices surrounding the digital speaker system.

(10) In the invention, the unified and integrated digital coding is performed on multiple transmission channels. By means of the thermometer coding and dynamic mismatch shaping, the repeatability of the coded digital signal sequences of each channel can be reduced while the original audio signals are contained in the coded digital signals of each channel, thereby reducing the correlation of the coded signal sequences of each channel, and improving the uniformity of the sound field of the spatial radiated signals of the multi-channel system. Meanwhile, the noise power of the system radiation is evenly dispersed to the entire radiation space, thereby avoiding the reduction in sound quality of local regions caused by the local accumulation of noise in the conventional multi-channel system.

Wherein 1. a sound source; 2. an input format converter; 3. a multi-bit Σ-Δ modulator; 4. a thermometer coder; 5. a dynamic mismatch shaper; 6. a code converter; 7. a multi-channel digital amplifier; 8. a digital speaker load.

DETAILED DESCRIPTION OF THE INVENTION

The preferred embodiments of the invention will be described hereinafter with reference to the accompanying drawings, so that the benefits and features of the present invention can be understood more easily for those skilled in the art, thereby making a clear and specific definition of the protection scope of the present invention.

Currently the Class-D power amplifiers based on multi-bit Σ-Δ modulator have been widely promoted and applied. However, such digital power amplifiers performs the digital coding based on PWM only for single transmission channel, and do not consider the problem of the unified and integrated coding of multiple channels working together, also do not consider the problem of frequency response deviation correction and decorrelation of multiple channels working together, as well as the problem of uniformity of the spatial radiated acoustic field of the signals and noises. Furthermore, the PDM codes generated by the conventional Σ-Δ modulation are converted into PWM codes using the analog circuit, however, the physical implementation is complicated, and the transportability and editability of the system are poor. The method and device for driving a digital speaker based on code conversion of the invention achieve the conversion of PDM codes into PWM codes by digital signal process algorithms, and absolutely can achieve the transplantation and modification of the code converter by code replication and editing within digital signal processors, such as DSP and FPGA. The device for driving a digital speaker of the invention comprise a thermometer coder and a dynamic mismatch shaper and can perform unified and integrated digital coding on the multiple transmission channels, and correct the frequency response difference of the multiple channels and perform decorrelation on the output signals of channels when the multiple channels work together. Furthermore, the method and device of the invention perform homogenization treatment on the sound field of the signal and noise spatially radiated by the system, thereby ensuring the uniformity characteristic of spatial distribution of the sound field of the signals and noises, and avoiding the reduction in sound quality caused by the accumulation of signals and noises in spatial local regions.

As shown in FIG. 5, a device for driving a digit speaker based on code conversion is provided according to the invention. The main body of the device comprises a sound source 1, an input format converter 2, a multi-bit Σ-Δ modulator 3, a thermometer coder 4, a dynamic mismatch shaper 5, a code converter 6, a multi-channel digital amplifier 7 and a digital speaker load 8.

The sound source 8 may be the sound source files in MP3 format stored in the hard discs of PCs and output in digital format via USB ports; also may be the sound source files stored in MP3 players and output in analog format; and also may be the test signals in audio-frequency range generated by a signal source and output in analog format.

The input format converter 2 is electrically coupled to the output end of the sound source 1. The input format converter 2 contains two input interfaces of digital input format and analog input Format. For the digital input format, by utilizing a USB interface chip typed PCM2706 of Ti Company, the files in MP3 format stored in PCs can be read real-time in terms of a bit-width of 16 and a sampling rate of 44.1 KHz into FPGA chips typed Cyclone III EP3C80F484C8 through I2S interface protocol via a USB port. For the analog input format, by utilizing an analog-to-digital conversion chip typed AD1877 of Analog Devices Company, the analog sound source signals can be converted into PCM coded signals with a bit-width of 16 and a sampling rate of 44.1 KHz, and also read real-time into FPGA chips through I2S interface protocol.

Figure 10:
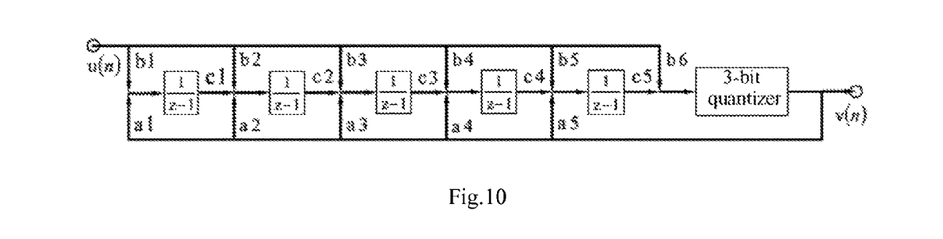
FIG. 10 is a flow chart showing the signal processing of the fifth-order CIFB modulation structure utilized by the Σ-Δ modulator of according to an embodiment of the invention.
Figure 13:
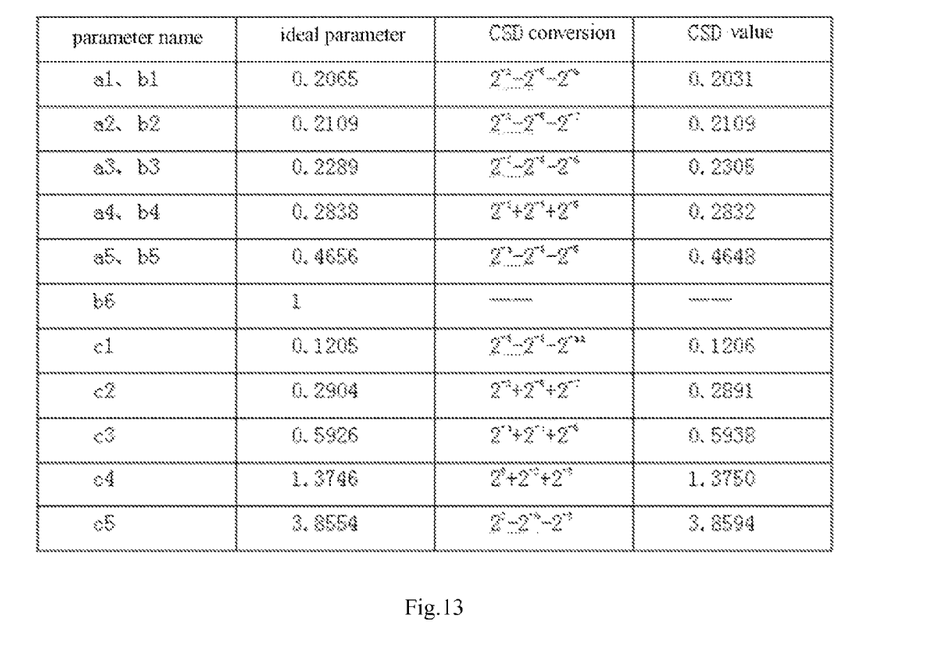
FIG. 13 is a table showing the parameters of the fifth-order CIFB structure utilized by the 3-bit Σ-Δ modulator according to the embodiment of the invention.

The multi-bit Σ-Δ modulator 5 is electrically coupled to the output end of the input format converter 2. Firstly, the PCM coded signals of 44.1 KHz and 16-bit are processed with a 5-level over-sampling interpolation inside the FPGA chip, wherein the first level interpolation factor is 5, and the sampling rate is 220.5 KHz, the second level interpolation factor is 3 and the sampling rate is 661.5 KHz, the third level interpolation factor is 3 and the sampling rate further increases to 1.9845 MHz, the fourth level interpolation factor is 2 and the sampling rate increases to 3.969 MHz, and the fifth level interpolation factor is 2 and the sampling rate further increases to 7.938 MHz. After the 180 times interpolating, the original signals of 44.1 KHz and 16-bit are converted into the over-sampling PCM coded signals of 7.938 MHz and 16-bit. Then the over-sampling PCM coded signals of 7.938 MHz and 16-bit are converted into PCM coded signals of 7.938 MHz and 3-bit by 3-bit Σ-Δ modulation. As shown in FIG. 10, in this embodiment, the 3-bit Σ-Δ modulator is provided with a fifth-order CIFB (Cascaded Integrators with Distributed Feedback) topology construction, and the output of which is corresponding to the 9-stage quantification level states. The parameters of the Σ-Δ modulator is shown in table 1. In order to save hardware resource and reduce the realization cost, the constant multiplication operation is usually substituted by the shift addition operation inside the FPGA chip, and the parameters of the Σ-Δ modulator are depicted in CSD code.

Figure 11:
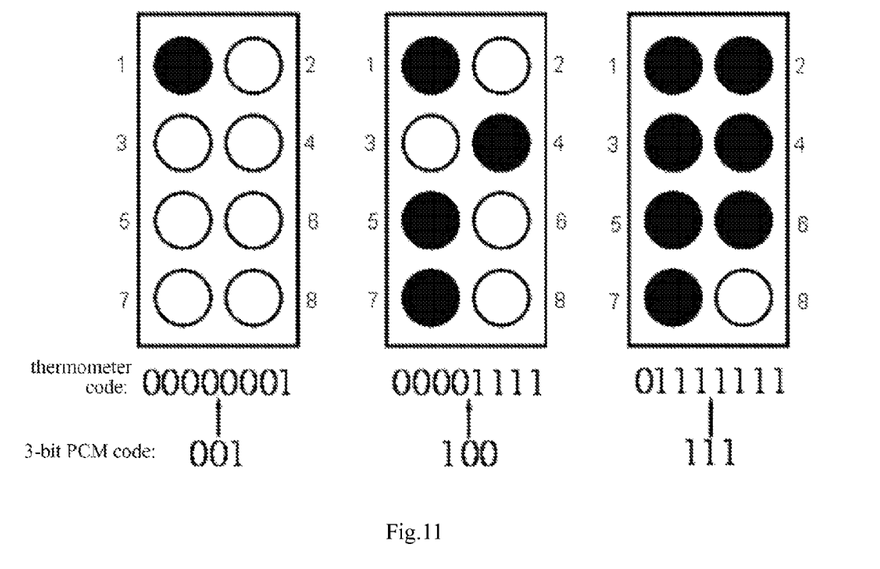
FIG. 11 is a schematic drawing illustrating the on/off control of the thermometer coded vectors according to the embodiment of the invention.

The thermometer coder 4 is electrically coupled to the output end of the multi-bit Σ-Δ modulator 3. The thermometer coder 4 converts the PCM modulated signals of 7.938 MHz and 3-bit by thermometer coding into dinary code vectors of 7.938 MHz and 1-bit corresponding to the 8 digital channels. As shown in FIG. 11, when the PCM code of 3-bit is '001' and the converted thermometer code therefrom is '00000001', this demonstrates only one of the 8 digital channels has the output state of '1', and the other 7 digital channels have the output state of '0'. When the PCM code of 3-bit is '100' and converted thermometer code therefrom is '00001111', this demonstrate four of the 8 digital channels have the output state of '1', and the other 4 digital channels have the output state of '0'. When the PCM code of 3-bit is '111' and the converted thermometer code therefrom is '01111111', this demonstrate only one of the 8 digital channels has the state of '0', and the other 7 digital channels have the state of '1'.

Figure 12:
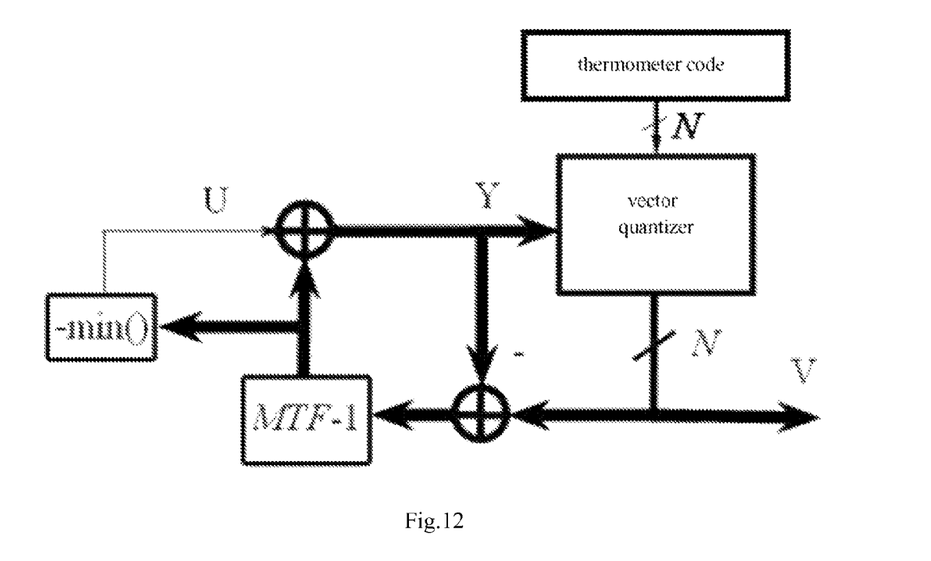
FIG. 12 is a flow chart showing the VFMS mismatch shaping algorithm utilized by the dynamic mismatch shaper according to the embodiment of the invention.

The dynamic mismatch shaper 5 is electrically coupled to the output end of the thermometer coder 4 and used for eliminating the nonlinear harmonic distortion components arisen from the frequency difference between digital channels. The dynamic mismatch shaper 5 reorders the 8-bit thermometer codes according to the optimum criteria of least nonlinear harmonic distortion components, thereby determining the code assigning way to the 8 digital channels. As shown in FIG. 11, when the thermometer code is '00001111', after the reordering of the dynamic mismatch shaper 5, it is determined that the code '1' is assigned to the channels of 1, 4, 5 and 7, and the code '0' is assigned to the channels of 2, 3, band 8, thereby ensuring that the composite signals formed by the 8 digital channels contain the least harmonic distortion components. In this embodiment, the dynamic mismatch shaper utilizes VFMS (Vector-Feedback mismatch shaping) algorithm, and the signal processing is shown in FIG. 12, wherein the module MTF-1 represents the designed shaping filter, which is used for shaping the error signals generated by the vector quantizer to push the harmonic components to the high frequency section out of band, and the MTF utilizes the second-order structure, the expression of z domain is $(1-z^{-1})^2$. $-\min()$ represents selecting the minimum value from the vectors and negating it. Within the FPGA chip, after the dynamic mismatch shaping, the harmonic components existing in the original Σ-Δ coded signals are push to high frequency section out of band, thereby improving the sound quality of the sound source signals in band.

Figure 6:
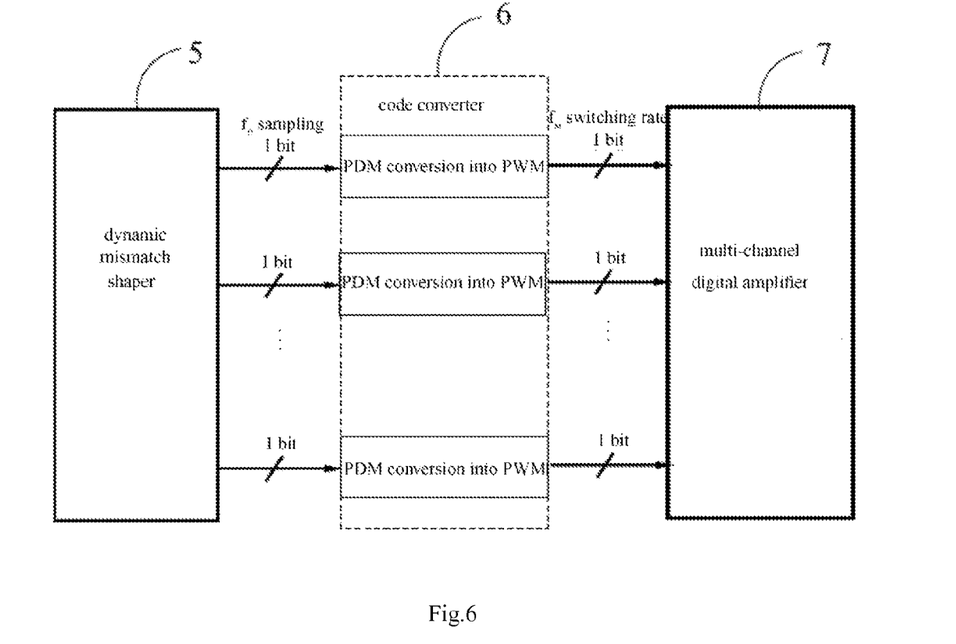
FIG. 6 is a schematic drawing showing the realization process of the code converter of the invention.
Figure 7:
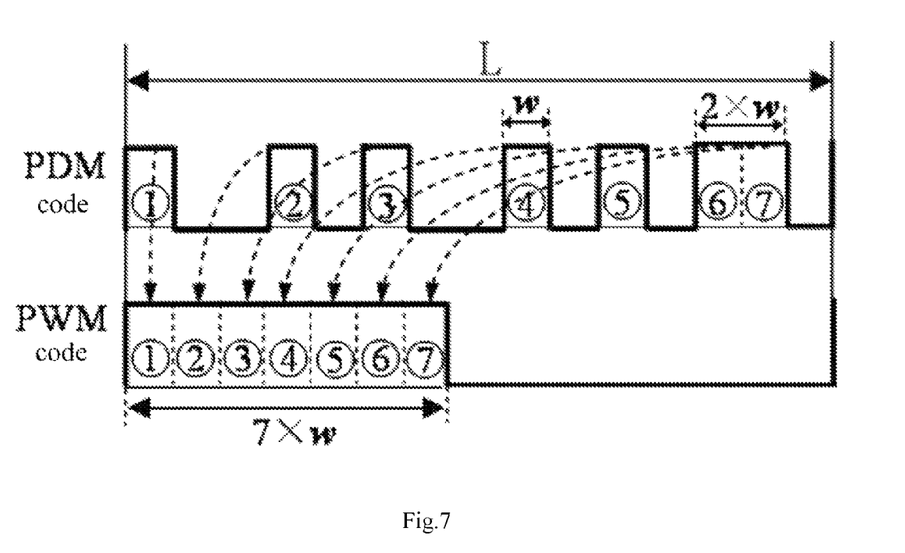
FIG. 7 is a schematic drawing showing the conversion of the PDM coded signals into the PWM coded signals of the code converter of the invention.
Figure 8:
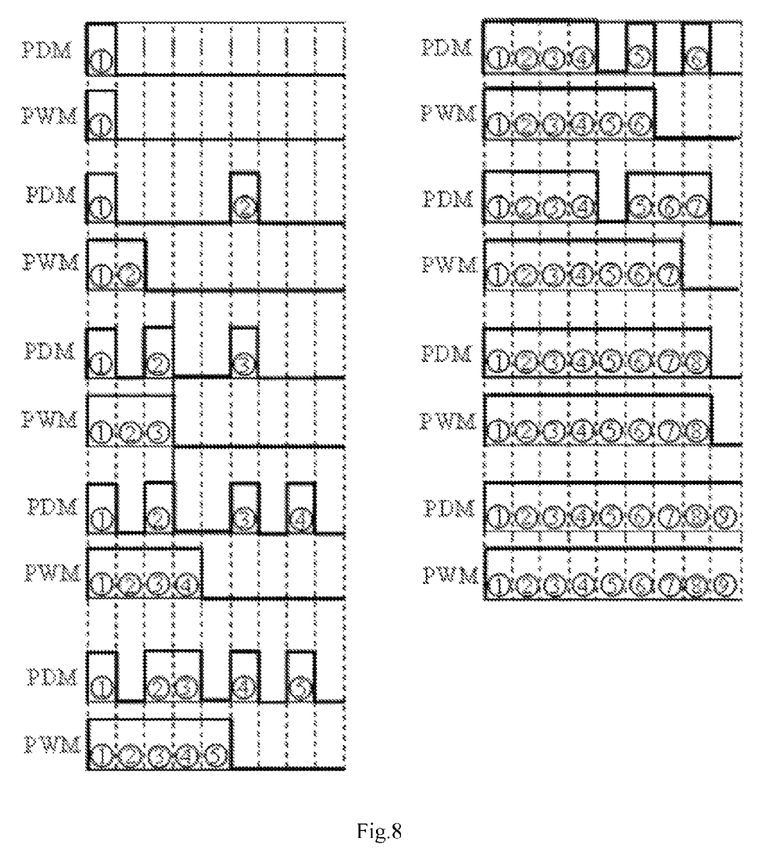
FIG. 8 is a schematic drawing showing the conversion of the PDM coded data frame containing 9 digital chips into the PWM coded data frame of the code converter of the invention.

The code converter 6 is electrically coupled to the output end of the dynamic mismatch shaper 5. As shown in FIG. 6, the code converter 6 performs data frame splitting in terms of a switching rate of 793.8 KHz on the mismatch shaped 1-bit PDM coded signal flow with a switching rate of 7.938 MHz on the 8 transmission channels, then determines the pulse width of the PWM coded signals for each data frame of each channel according to the quantity of high level (state '1') contained in the data frame, thereby generating the 1-bit PWM coded signals with a switching rate of 793.8 KHz.

The multi-channel digital power amplifier 7 is electrically coupled to the output end of the code converter 6. In this embodiment, the digital power amplifier chip is a digital power amplifier chip typed TAS5121 from Ti Company, the response time of the chip is 100 ns order of magnitude, and the distortionless response of PWM coded control signals of 793.8 KHz can be achieved. The power amplifier chip contains two half-bridge channels therein, and the two half-bridge channels can drive a speaker unit to form a full-bridge power amplification network. One path of the PWM codes generated by the code converter is directly output to the input end of one half-bridge channel, and the other path is output inversely to the input end of the other half-bridge channel. This set of differential PWM control signals are utilized to control the on/off action of the four MOSFETs, thereby forming the current path of the two switching states of '+1' and '−1'.

The digital speaker load 8 is electrically coupled to the output end of the multi-channel digital power amplifier 7. In this embodiment, the digital speaker load 8 is a speaker unit of multiple voice coils consisted of 8 voice coil windings. the direct current resistance of each voice coil winding is 4Ω, and rated power of each voice coil winding is 10 W. The caliber of the speaker unit is 6.5 inches.

In this embodiment, the supply voltage of the multi-channel digital power amplifier is 12 V. When no input signals of sound source is applied, the frequency spectrum amplitude of the electrical noise signals on the lead wire of the speaker within the whole band is measured as 10 dBm using the 100 MHz oscilloscope typed WaveJet 314 of LeCroy company. In the case of 12V supply voltage and 4Ω speaker load, the maximum output power of the system is 11.5 W, the THD+N of the system output signals in the frequency range of 20 Hz to 20 KHz is about 0.05%, and the electroacoustic conversion efficiency of the system is 80%.

The above embodiments are described for illustrating the technical concept and features of invention, the aim is intended to enable a person skilled in the art to appreciate the content of the invention and further implement it, and the protecting scope of the invention can not be limited hereby. Also, any equivalent variations or modifications made according to the spirit of the invention should be covered within the protecting scope of the invention.

What is claimed is:

1. A method for driving a digital speaker based on code conversion, successively comprises steps of:
    (1) converting input signals into pulse code modulated (PCM) signals meeting a requirement of expected parameters;
    (2) performing multi-bit Σ-Δ modulation to the PCM signals, to push the noise energy within an audio bandwidth out of the audio band;
    (3) converting low-bit PCM signals having a bit-width of M bit into 1-bit coded signals corresponding to $2^M$ transmission channels of a digital power amplifier and a speaker load by a thermometer code conversion, and distributing the coded signals to $2^M$ digital channels in terms of equal weight, the digital signals of each channel only having two coding states of '0' and '1';
    (4) applying dynamic mismatch-shaping to the binary status code vectors of $2^M$ channels obtained by the thermometer code conversion based on the binary status codes of '0' and '1', to eliminate harmonic distortion components arisen from a frequency response difference between post-stage digital-to-analog conversion loads of $2^M$ channels and reduce the noise amplitude;
    (5) converting pulse density modulation (PDM) coded signals of each channel obtained after multi-bit Σ-Δ modulation and dynamic mismatch-shaping into pulse width modulation (PWM) coded signals; and
    (6) controlling the on/off status switching of the MOSFET of a full-bridge power amplification network to drive a digital speaker load sound, in such a way that each digital transmission channel controls the on/off action of the full-bridge power amplification circuit by differential PWM signals formed by the converted PWM coded signals and the inverse signals thereof.

2. The method as claimed in claim 1, wherein the input signals to be converted in step (1) are analog signals which are firstly converted into digital signals based on PCM coding by an analog-to-digital conversion, and then converted in terms of the requirement of parameters of a designated bit-width and a desired sampling rate into PCM coded signals; or digital signals which are converted into PCM coded signals in terms of the requirement of parameters of a designated bit-width and a desired sampling rate.

3. The method as claimed in claim 1, wherein the process of the multi-bit Σ-Δ modulation in step (2) is as follows: interpolation filtering by an interpolation filter the high-bit PCM code after equalization processing according to a designated over-sampling factor, to obtain over-sampling PCM coded signals; and then performing Σ-Δ modulation to push the noise energy within audio bandwidth out of the audio band.

4. The method as claimed in claim 1, wherein the structure and parameters of the multi-bit Σ-Δ modulator applied by the multi-bit Σ-Δ modulation in step (2) are designed utilizing either higher-order single-stage serial modulation method or multi-stage parallel modulation method, such that the noise-shaping is performed on the over-sampling signals output from the interpolation filter to push the noise energy out of the audio band.

5. The method as claimed in claim 1, wherein in the dynamic mismatch-shaping processing of step (4), one of the DWA, VFMS and TSMS algorithms is utilized to design the structure and parameters of a dynamic mismatch-shaper, to whiten and shape the nonlinear harmonic distortion frequency spectrum arisen from frequency response difference between multiple digital channels, for reducing the magnitude of the harmonic distortion components in band and pushing the power thereof to the high frequency section out of band, thereby increasing the magnitude of Signal to Noise Ratio in band while eliminating the harmonic distortion components in band.

6. The method as claimed in claim 1, wherein in the pulse width modulation code conversion of step (5), the 1-bit data stream with a switching rate of $f_o$ of $2^M$ channels obtained by a dynamic mismatch-shaper is converted in terms of PWM coding into 1-bit data stream with a switching rate of $f_M$ of $2^M$ channels, and the original PDM coded signals with a high switching rate being converted into PWM coded signals with a low switching rate on each channel.

7. The method as claimed in claim 1, wherein in the pulse width modulation code conversion of step (5), the coded signals in PDM format are converted in terms of the principle of equal length of data frame into PWM coded signals, and during the conversion the data frames of the PDM and PWM coded signals align with each other on time, the PDM coded signals comprising multiple high levels within the length of one data frame, and the same quantity of high levels being still retained in the course of converting into PWM coded signals, and the pulse width of the high levels of the PWM coded signals being equal to the sum of the pulse width of all the high levels of the PDM coded signal.

8. The method as claimed in claim 1, wherein when the on/off action of the full-bridge power amplification circuit is controlled by the binary status code of '0' and '1', provide that 'HA' and 'LA' respectively represent the reference numbers of the high-edge and low-edge MOSFETs at A side, and 'HB' and 'LB' respectively represent the reference numbers of the high-edge and low-edge MOSFETs at B side, when inputting at the state of '0', HA and LB being simultaneously turned on and HB and LA being simultaneously turned off, such that the current flows from A end to B end through the speaker unit and the voltage on the speaker unit is '+$V_{CC}$', and when inputting at the state of '1', HB and LA being simultaneously turned on and HA and LB being simultaneously turned off, such that the current flows from B end to A end through the speaker unit and the voltage on the speaker unit is '−$V_{CC}$'.

9. The method as claimed in claim 1, wherein the digital speaker load of step (6) is selected from a digital speaker array comprising a plurality of speaker units, a speaker unit having multiple voice coil windings, and a digital speaker array consisting of a plurality of speaker units of multiple voice coils.

10. A device for driving a digital speaker based on code conversion, comprises:

A sound source (1);

An input format converter (2), which is electrically coupled to the output end of the sound source (1), for converting the input signals into high-bit PCM coded signals with a bit-width of N and a sampling rate of $f_S$;

A multi-bit Σ-Δ modulator (3), which is electrically coupled to the output end of the input format converter (2), for converting the input N bit PCM coded signals into low-bit PCM coded signals with a bit-width of M and a sampling rate of $f_o$;

A thermometer coder (4), which is electrically coupled to the output end of the multi-bit Σ-Δ modulator (3), for converting M bit PCM coded signals into binary code vectors with a bit-width of M and a sampling rate of $f_o$ corresponding to $2^M$ digital channels;

A dynamic mismatch shaper (5), which is electrically coupled to the output end of the thermometer coder (4), for eliminating the nonlinear harmonic distortion components of spatial domain synthetic signals arisen from the frequency response difference between array element channels of the digital speaker load, reducing the magnitude of harmonic distortion components in band, and pushing the power of harmonic frequency components to the high frequency section out of band;

A code converter (6), which is electrically connected to the output end of the dynamic mismatch shaper (5), for performing data frame splitting in terms of a low switching rate $f_M$ on the binary status code data stream of $2^M$ digital channels with a high switching rate and a sampling rate of $f_o$, such that each data frame of PDM coding on each transmission channel is converted in terms of the quantity of high levels into corresponding data frame of PWM coded signals;

A multi-channel digital amplifier (7), which is electrically coupled to the output end of the code converter (6), for amplifying power of the coded signals of $2^M$ digital channels, and driving the on/off action of the post-stage digital load; and A digital speaker load (8), which is electrically coupled to the output end of the multi-channel digital amplifier (7), for achieving the electro-acoustic conversion and converting the digital electric signals of switch into air vibration signals in analog format.

11. The device as claimed in claim 10, wherein the sound source is the information to be played by a system, including analogy signals or digital coded signals.

12. The device as claimed in claim 10, wherein the input format converter (2) contains digital interface circuits and interface protocol programs which are compatible with the existing digital interface formats.

13. The device as claimed in claim 10, wherein the signal processing of the Σ-Δ modulator (3) is as follows: at first the PCM coded signals with a bit-width of N and a sampling rate of $f_s$ are subjected to over-sampling interpolation filtering according to the over-sampling factor $m_0$ to obtain the PCM coded signals with a bit-width of N and a sampling rate of $f_0$, and then the PCM coded signals with a bit-width of N are converted into low-bit PCM coded signals with a bit-width of M, M<N.

14. The device as claimed in claim 10, wherein the Σ-Δ modulator (3) performs noise shaping on the over-sampling signals output from the interpolation filter to push the noise energy out of band, in terms of a higher-order single-stage serial modulator structure or a multi-stage parallel modulator structure.

15. The device as claimed in claim 10, wherein the dynamic mismatch shaper utilizes one of the DWA, VFMS and TSMS algorithms to shape the 1-bit coded signal vectors of $2^M$ digital channels on the basis of the binary status codes of '0' and '1', for eliminating the nonlinear harmonic distortion frequency spectrum components arisen from the frequency response difference between multiple array element channels, thereby reducing the power level of the noise in voice-band.

16. The device as claimed in claim 10, wherein the quantity of channels of the multi-channel digital amplifier (7) is $2^M$, the digital amplifier on each channel is a full-bridge power amplification circuit comprising two half-bridge power amplification circuits, and each half-bridge including a high-edge MOSFET and a low-edge MOSFET.

17. The device as claimed in claim 10, wherein each digital channel of the digital speaker load (8) is selected from single speaker unit, multiple speaker units, single voice coil, multiple voice coils and any combination thereof.

18. The device as claimed in claim 10, wherein the array configuration of the digital speaker load is arranged according to the quantity of speaker units and the practical application demands.

\* \* \* \* \*